US006315803B1

(12) United States Patent
Ina et al.

(10) Patent No.: US 6,315,803 B1
(45) Date of Patent: *Nov. 13, 2001

(54) POLISHING COMPOSITION AND POLISHING PROCESS

(75) Inventors: Katsuyoshi Ina; Tadahiro Kitamura, both of Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/452,384

(22) Filed: Dec. 1, 1999

(30) Foreign Application Priority Data

Sep. 20, 1999 (JP) ................................... 11-266049

(51) Int. Cl.$^7$ ................................. C23F 1/18; C23F 1/30
(52) U.S. Cl. ................................. 51/307; 51/308; 51/309; 106/3; 216/87; 252/79.1; 438/692; 438/693
(58) Field of Search .......................... 51/308, 309, 307; 216/89; 252/79.1; 438/692, 693; 106/3

(56) References Cited

U.S. PATENT DOCUMENTS

| | | | |
|---|---|---|---|
| 5,391,258 | 2/1995 | Brancaleoni et al. | 156/636 |
| 5,476,606 | 12/1995 | Brancaleoni et al. | 252/79.1 |
| 5,575,885 | 11/1996 | Hirabayashi et al. | 156/626.1 |
| 5,770,095 | 6/1998 | Sasaki et al. | 216/38 |
| 5,897,375 | 4/1999 | Watts et al. | 438/673 |
| 5,954,997 | * 9/1999 | Kaufman et al. | 252/79.1 |
| 6,001,730 | 12/1999 | Farkas et al. | 438/627 |
| 6,139,763 | * 10/2000 | Ina et al. | 216/89 |
| 6,143,656 | * 11/2000 | Yang et al. | 438/687 |
| 6,171,352 | * 1/2001 | Lee et al. | 51/307 |

FOREIGN PATENT DOCUMENTS

| | | |
|---|---|---|
| 0 659 858 | 6/1995 | (EP) . |
| 0 747 939 A3 | 12/1996 | (EP) . |
| WO-98/04646 * | 2/1998 | (WO) . |
| WO 98/49723 | 11/1998 | (WO) . |

* cited by examiner

Primary Examiner—C. Melissa Koslow
(74) Attorney, Agent, or Firm—Oblon, Spivak, McClelland, Maier & Neustadt, P.C.

(57) ABSTRACT

Object: To provide a polishing composition which is capable of polishing a tantalum-containing compound at a high stock removal rate and whereby the copper surface after polishing is scarcely corroded, and to provide a polishing process where dishing can be minimized. Means to accomplish the object: A polishing composition comprising an abrasive, oxalic acid, an ethylenediamine derivative, a benzotriazole derivative and water and not containing an oxidizing agent, and a polishing composition comprising an abrasive, oxalic acid, an ethylenediamine derivative, a benzotriazole derivative, water and hydrogen peroxide.

Further, a polishing process for forming a copper printed wiring, which is a polishing process for a semiconductor device and which comprises a first polishing step wherein polishing is completed immediately before reaching a barrier layer while a copper layer still slightly remains, and second and third polishing steps wherein the remaining copper layer and the barrier layer are polished, wherein in the second polishing step, a polishing composition containing hydrogen peroxide is used and all the copper layer to be removed, is removed by polishing, and then, in the third polishing step, a polishing composition not containing hydrogen peroxide is used and all the barrier layer to be removed, is removed by polishing.

16 Claims, No Drawings

POLISHING COMPOSITION AND POLISHING PROCESS

BACKGROUND OF THE INVENTION

1. Field of the Invention

The present invention relates to a polishing composition to be used for polishing for planarization of the surface of semiconductors. More particularly, it relates to a polishing composition useful for forming an excellent polished surface having an excellent planarization characteristic in polishing for planarization of the surface containing copper and tantalum or a tantalum-containing compound, and a polishing process employing this composition.

2. Prior Art

Progress of so-called high technology products including computers has been remarkable in recent years, and parts to be used for such products, such as ULSI, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly severe.

Further, to cope with an increase in resistance of the wiring due to refinement of the wiring, it has been studied to employ copper wiring instead of tungsten wiring and aluminum wiring, as the wiring material.

By its nature, copper is hardly processable by etching, and accordingly, it requires the following process. Namely, after forming wiring grooves and perforations on an insulating layer, copper wirings are formed by sputtering or plating, and then an unnecessary copper layer deposited on the insulating layer is removed by chemical mechanical polishing (hereinafter referred to as CMP) which is a combination of mechanical polishing and chemical polishing.

However, in such a process, it may happen that copper atoms will diffuse into the insulating layer to deteriorate the device properties. Therefore, for the purpose of preventing diffusion of copper atoms, it has been studied to provide a barrier layer on the insulating layer having wiring grooves or perforations formed. As a material for such a barrier layer, metal tantalum or a tantalum-containing compound (hereinafter will generally be referred to as a tantalum-containing compound) is most suitable also from the viewpoint of the reliability of the device and is expected to be employed mostly in the future.

Accordingly, in such a CMP process for a semiconductor device containing such a copper layer and a tantalum-containing compound, firstly the copper layer as the outermost layer and then the tantalum-containing compound layer as the barrier layer, are polished, respectively, and polishing will be completed when it has reached the insulating layer of e.g. silicon dioxide or silicon trifluoride.

PROBLEM TO BE SOLVED BY THE INVENTION

In such a CMP process for forming copper wirings, the following problems exist. Namely, the most serious problems may be such that the copper wirings after polishing are recessed as compared with the insulating layer (so-called dishing), and a portion where wirings are densely formed, is recessed as compared with other portions (so-called erosion). As an ideal process, it is desired that by using only one type of a polishing composition, the copper layer and the tantalum-containing compound layer are uniformly removed by polishing in a single polishing step, and polishing will be completed certainly when it has reached the insulating layer.

However, copper and a tantalum-containing compound are different in their hardness, chemical stability and other mechanical properties and accordingly in the processability, and thus, it is difficult to adopt such an ideal polishing process. Accordingly, the following two or three step polishing process (hereinafter referred to as two step polishing or three step polishing) is being studied.

Such two step polishing or three step polishing will bring about a cumbersomeness such that CMP processing conditions have to be set for the respective steps, and an increase of costs due to the cumbersomeness. Accordingly, it has been desired to employ as small a number of types of the polishing compositions as possible which are suitable for CMP processing of both copper and the tantalum-containing compound and to selectively control the CMP processing conditions by a means not to accompany an increase of costs.

Conventional two step polishing or three step polishing is generally classified into the following two types depending upon the first polishing step (hereinafter referred to as first polishing) and the second polishing step (hereinafter referred to as second polishing).

Firstly, the first type is such that in the first polishing, using a polishing composition capable of polishing a copper layer at a high efficiency, the copper layer is polished using e.g. a tantalum-containing compound layer as a stopper until such a tantalum-containing compound layer is reached. Then, in the second polishing, using a polishing composition capable of polishing mainly the tantalum-containing compound at a high efficiency, the tantalum-containing compound layer is polished until the insulating layer is reached. (Hereinafter, this method will be referred to as an overpolishing method.) Further, if necessary, in a third polishing step (hereinafter referred to as third polishing), polishing defects (hereinafter referred to as scratches) may be mainly mended, and the insulating layer may be polished to reduce the dishing.

On the other hand, the second type is such that in the first polishing, for the purpose of not forming various surface damages such as erosion, dishing, etc., on the copper layer surface, polishing is terminated immediately before reaching the tantalum-containing compound layer i.e. while a copper layer still slightly remains, and then, in the second polishing, the remaining thin copper layer and the tantalum-containing compound layer are continuously polished, and polishing is completed when it has reached the insulating layer. (Hereinafter, this method will be referred to as an underpolishing method.) Further, as mentioned above, if necessary, in a third polishing, scratches may be mainly mended, and the insulating layer may be polished to reduce the dishing.

Further, the polishing composition to be used in the first polishing is required to have a property such that it is capable of polishing the copper layer at a high stock removal rate. With respect to such a polishing composition for a copper layer, for example, JP-A-07-233485 discloses a polishing liquid for a copper type metal layer, which comprises at least one organic acid selected from the group consisting of aminoacetic acid and amidesulfuric acid, an oxidizing agent and water, and a method for producing a semiconductor device using such a polishing liquid.

If this polishing liquid is used for polishing a copper layer, a relatively high stock removal rate is obtainable. It is believed that copper atoms on the copper layer surface become copper ions, and such copper ions are taken into a chelate compound, whereby a high stock removal rate can be obtained. Such a polishing composition is considered to be useful for the first polishing.

However, an ideal polishing composition which is useful for polishing a tantalum-containing compound layer i.e. for the second polishing, has not heretofore been proposed for the CMP process based on the above concept. Under these circumstances, the present inventors have previously proposed a polishing composition comprising an abrasive, an oxidizing agent capable of oxidizing tantalum, a reducing agent capable of reducing tantalum oxide and water, and a polishing method employing it in JP10-342106. By this invention, a tantalum-containing compound can be polished certainly at a high stock removal rate, and this polishing composition can be used for the second polishing.

However, when polishing is carried out by means of a polishing composition composed solely of the above-mentioned components, a new problem has been brought about that the copper surface after polishing is likely to be corroded. Further, when this composition for the second polishing was used for polishing a wafer having copper wirings, dishing was substantial, and it was not practically useful.

The present invention has been made to solve the above problems. Namely, it is an object of the present invention to provide a polishing composition which is capable of polishing a tantalum-containing compound layer at a high stock removal rate and whereby the copper surface after the polishing will scarcely be corroded, and to provide a polishing process which is capable of suppressing dishing substantially.

MEANS TO SOLVE THE PROBLEMS

In order to solve the above-described problems, the present invention provides a polishing composition comprising an abrasive, oxalic acid, an ethylenediamine derivative, a benzotriazole derivative and water, and not containing an oxidizing agent, and a polishing composition comprising an abrasive, oxalic acid, an ethylenediamine derivative, a benzotriazole derivative, water and hydrogen peroxide.

Further, the above polishing compositions are preferably characterized in that the pH is within a range of from 3 to 6, the abrasive is silicon dioxide, the abrasive is colloidal silica, the abrasive has a specific surface area of from 50 to 300 $m^2/g$ and its content is from 10 to 200 g/l based on the polishing composition, the content of oxalic acid is within a range of from 0.001 to 0.01 mol/l based on the polishing composition, the ethylenediamine derivative is an ethylenediamine and its content is from 0.001 to 0.005 mol/l based on the polishing composition, or the benzotriazole derivative is benzotriazole and its content is within a range of from 0.0004 to 0.002 mol/l, based on the polishing composition. Further, the content of hydrogen peroxide is within a range of from 1 to 30 g/l, based on the polishing composition.

Further, in order to solve the above problems, the present invention provides a polishing process for forming a copper printed wiring, which is a polishing process for a semiconductor device containing a copper printed wiring in its interior and which comprises a first polishing step wherein polishing is completed immediately before reaching a barrier layer while a copper layer still slightly remains, and second and third polishing steps wherein the remaining copper layer and the barrier layer are polished, wherein in the second polishing step, a polishing composition containing hydrogen peroxide is used and all the copper layer to be removed, is removed by polishing, and then, in the third polishing step, a polishing composition not containing hydrogen peroxide is used and all the barrier layer to be removed, is removed by polishing.

Further, the polishing process is preferably characterized in that the amount of hydrogen peroxide in the polishing composition in the second polishing step, is controlled depending upon the thickness of the copper layer to be removed by the polishing in the second step, or depending upon the thickness of the copper layer to be removed and the thickness of the barrier layer to be removed by the polishing in the third step. In the polishing process, the polishing composition used in the third polishing step preferably comprises an abrasive, oxalic acid, an ethylenediamine derivative, a benzotriazole derivative and water, and the polishing composition used in the second polishing step preferably comprises an abrasive, oxalic acid, an ethylenediamine derivative, a benzotriazole derivative, water and hydrogen peroxide.

Further, the polishing process is preferably characterized in that the polishing composition used in the second and third polishing steps has a pH within a range of from 3 to 6, the abrasive in the polishing composition used in the second and third polishing steps is silicon dioxide, the abrasive in the polishing composition used in the second and third polishing steps is colloidal silica, the abrasive in the polishing composition used in the second and third polishing steps, has a specific surface area of from 50 to 300 $m^2/g$ and its content is from 10 to 200 g/l, based on the polishing composition, the content of oxalic acid in the polishing composition used in the second and third polishing steps, is within a range of from 0.001 to 0.01 mol/l, based on the polishing composition, the ethylenediamine derivative in the polishing composition used in the second and third polishing steps, is ethylenediamine and its content is from 0.001 to 0.005 mol/l, based on the polishing composition, the benzotriazole derivative in the polishing composition used in the second and third polishing steps, is benzotriazole and its content is from 0.0004 to 0.002 mol/l, based on the polishing composition, or the content of hydrogen peroxide in the polishing composition used in the second polishing step, is within a range of from 1 to 30 g/l, based on the polishing composition.

Now, the present invention will be described in detail. The following description is intended to facilitate understanding of the present invention, and by no means restricts the present invention.

As mentioned above, in the first aspect, the present invention provides a polishing composition comprising an abrasive, oxalic acid, an ethylenediamine derivative, a benzotriazole derivative and water and not containing an oxidizing agent, and in the second aspect, the present invention provides a polishing composition comprising an abrasive, oxalic acid, an ethylenediamine derivative, a benzotriazole derivative, water and hydrogen peroxide.

Further, in the third aspect, the present invention provides a polishing process for forming a copper printed wiring, wherein polishing steps employing the first and second aspects of the present invention are effectively combined. Namely, it is a polishing process for a semiconductor device containing a copper printed wiring in its interior and comprises a first polishing step wherein polishing is completed immediately before reaching a barrier layer while a copper layer still slightly remains, and second and third polishing steps wherein the remaining copper layer and the barrier layer are polished.

According to the third aspect of the present invention, in the second polishing step, a polishing composition containing an oxidizing agent, i.e. the polishing composition according to the second aspect of the present invention, is used and all the copper layer to be removed, is removed by polishing, and then, in the third polishing step, a polishing composition not containing an oxidizing agent is used and all the barrier layer to be removed, is removed by polishing. Here, this third polishing step is not intended to reduce scratches on the insulating layer or to reduce dishing of the copper wirings, as described with respect to the conventional method, and is carried out simply for the purpose of removing the barrier layer (in the present invention, the barrier layer corresponds to the tantalum-containing compound layer) by polishing.

Hereinafter, the first aspect of the present invention will be referred to simply as "first invention", the second aspect of the present invention will be referred to simply as "second invention", the composition common to both the first and second inventions will be referred to simply as "composition of the present invention". Further, the polishing process according to the third aspect of the present invention will be referred to as "polishing process of the present invention", wherein the first polishing step, the second polishing step and the third polishing step will be referred to as "first polishing", "second polishing" and "third polishing", and the polishing ability in each polishing step will be referred to as "stock removal rate". Further, the composition of the present invention and the polishing process of the present invention may generally be referred to as "present invention". In the present invention, "a copper layer to be removed" or "a barrier layer to be removed" means a copper layer or a barrier layer which should not remain after completion of polishing to form copper wirings, and specifically, it means the entire portion except for the portions embedded in the wiring grooves or perforations.

The first invention provides a polishing composition characterized in that it exhibits a low stock removal rate against a copper layer, a high stock removal rate against a tantalum-containing compound layer and a low stock removal rate against an insulating layer. This polishing composition of the first invention is used for overpolishing as the first polishing. Further, it is also effective as a polishing composition to be used for the subsequent second polishing wherein only the tantalum-containing compound layer is polished.

The second invention provides a polishing composition whereby the copper layer removal rate can freely be set by an addition of hydrogen peroxide and which exhibits a high stock removal rate against a tantalum-containing compound layer and a low stock removal rate against an insulating layer. The polishing composition of this second invention is used for underpolishing as the first polishing, and it is also effective as a polishing composition for the subsequent second polishing, wherein the copper layer and the tantalum-containing compound layer are polished continuously and at substantially the same stock removal rate.

The difference between the first and second inventions is that in the first invention, no oxidizing agent is contained, while in the second invention, hydrogen peroxide is incorporated as an oxidizing agent. Depending upon the presence or absence of this oxidizing agent, the stock removal rate against the copper layer changes, and by effectively controlling this change, it is possible to set a proper stock removal rate against during polishing. The surface oxidation against the tantalum-containing compound naturally proceeds also by an action of water in the polishing composition, as tantalum by its nature is stable in an oxidized state. This oxide is formed only at the very surface of the tantalum-containing compound layer and constitutes a passive state. This passive state is meant for a phenomenon wherein the oxide at the surface serves as a protective layer, whereby oxidation will not proceed inwardly from the surface.

The content of this oxalic acid is usually within a range of from 0.001 to 0.01 mol/l, preferably within a range of from 0.003 to 0.008, more preferably within a range of from 0.004 to 0.006 mol/l. If the content of oxalic acid exceeds this range, such will give no influence over the stock removal rate against the tantalum-containing compound layer, but the pH of the composition tends to be low, and corrosion of the copper layer is likely to be brought about, such being undesirable. On the other hand, if the content of oxalic acid is smaller than this range, the stock removal rate against the tantalum-containing compound tends to be low, such being undesirable.

U.S. Pat. Nos. 5,391,258 and 5,476,606 disclose a polishing composition wherein a dibasic acid is incorporated as a compound which suppresses the rate of removal of silica. Whereas, oxalic acid used in the the copper layer. Namely, according to the first invention, the stock removal rate against the copper layer is set to be low, and according to the second invention, the stock removal rate against the copper layer can be freely set at an optional level by adjusting the amount of hydrogen peroxide to be added.

As mentioned above, the composition of the present invention (common to the first and second inventions) is a polishing composition which has a high stock removal rate against a tantalum-containing compound layer, a low stock removal rate against an insulating layer (mainly a silica layer usually called a TEOS layer) and a corrosion proof function against the copper surface after polishing. The high stock removal rate against the tantalum-containing compound layer is attributable to the incorporation of oxalic acid, as described hereinafter, and the low stock removal rate against the insulating layer is attributable to the incorporation of ethylenediamine as described hereinafter. Further, the corrosion proof function against the copper surface after polishing is attributable to the incorporation of benzotriazole as described hereinafter.

The oxalic acid incorporated in the polishing composition of the present invention serves as a reducing agent in the polishing composition. The oxalic acid is believed to perform a function to again reduce the surface of the tantalum-containing compound once oxidized present invention does not per se have a function to suppress the rate of removal of silica, and it rather has a function to increase such removal rate.

The ethylenediamine derivative contained in the polishing composition of the present invention is preferably ethylenediamine. Ethylenediamine has a function to suppress the stock removal rate against the insulating layer. This function is believed to be commonly owned by an ethylenediamine derivative. Such an ethylenediamine derivative may, for example, be ethylenediamine, N-methylethylenediamine, N N-dimethylethylenediamine, N,N-dimethylethylenediamine, 1-fluoroethylenediamine, 1-chloroethylenediamine, 1-bromoethylenediamine, 1-iodoethylenediamine, 1-phenylethylenediamine, ethylenetriamine, ethylenediamine II acetic acid, or salts thereof.

By the incorporation of ethylenediamine, only the tantalum-containing compound layer can be polished without excessively polishing the insulating layer during the polishing operation. Ethylenediamine is incorporated to increase the pH of the polishing composition which has become strongly acidic by the above-mentioned incorporation of oxalic acid and to suppress the stock removal rate against the insulating layer. By increasing the pH, the copper layer after polishing tends to be scarcely corroded, and further, the waste water treatment may thereby be facilitated.

The content of ethylenediamine is usually within a range of from 0.001 to 0.005 mol/l, preferably within a range of from 0.002 to 0.04 mol/l, based on the polishing composition. If the content of ethylenediamine exceeds this range, the copper layer surface after polishing tends to be corroded, such being undesirable. On the other hand, if the content of ethylenediamine is smaller than this range, the stock removal rate against the insulating layer tends to be high, or the pH tends to be low, whereby the copper layer surface tends to be corroded, such being undesirable.

Next, the benzotriazole derivative to be incorporated in the polishing composition of the present invention is preferably benzotriazole. Benzotriazole forms a protective layer on the copper layer surface and has a function to suppress the stock removal rate against the copper layer in addition to the corrosion prevention after polishing, and this function is believed to be commonly owned by a benzotriazole derivative. Such a benzotriazole derivative may, for example, be benzotriazole, 2-methylbenzotriazole, 2-phenylbenzotriazole, 2-ethylbenzotriazole or 2-propylbenzotriazole.

The content of benzotriazole is usually from 0.0004 to 0.002 mol/l, preferably from 0.0006 to 0.0016 mol/l, ore preferably from 0.0008 to 0.0012 mol/l. If the content of benzotriazole exceeds this range, the stock removal rate against the copper layer tends to be suppressed too much, and especially in the case of the polishing composition of the second invention, the stock removal rate against the copper layer can not be set. On the other hand, if the content of benzotriazole is smaller than this range, the corrosion preventive effect against the copper layer tends to be inadequate, and corrosion is likely to take place by copper oxide or copper hydroxide on the copper surface after polishing.

The second invention provides a polishing composition containing hydrogen peroxide. The hydrogen peroxide serves as an oxidizing agent as mentioned above, and it oxidizes the copper layer surface and accelerates the stock removal rate. The hydrogen peroxide contains no metal ions and thus has little possibility of contaminating semiconductor devices, and yet, it has an adequate oxidizing power to oxidize the copper layer. The content of hydrogen peroxide is substantially proportional to the stock removal rate against the copper layer, and it is possible to freely set the stock removal rate by adjusting the content. However, the stock removal rate against the copper layer is related also to the content of the above-mentioned benzotriazole and is accordingly determined taking the contents of both components into consideration.

The content of the hydrogen peroxide is usually within a range of from 1 to 30 g/l, preferably from 3 to 20 g/l, based on the polishing composition. If the content of the hydrogen peroxide exceeds this range, the stock removal rate against the copper layer tends to be too high, such being undesirable. On the other hand, if the content of the hydrogen peroxide is smaller than this range, the stock removal rate against the copper layer tends to be too small, such being undesirable.

The abrasive contained in the present invention has a role as so-called abrasive grains and serves to perform mechanical polishing in the CMP processing. In a conventional polishing composition to be used for the CMP process, the abrasive may usually be, for example, silicon dioxide, aluminum oxide, cerium oxide, silicon nitride, zirconium oxide, silicon carbide, or manganese dioxide. Among these, as an abrasive to be used in the present invention, those which are stable even in the presence of additives such as oxalic acid, ethylenediamine, benzotriazole and hydrogen peroxide, are preferred. Accordingly, it is preferred to employ silicon dioxide which is chemically stable against these additives.

Further, it is preferred to employ an abrasive in a colloidal state with a uniform small particle size in order to reduce precipitation of the abrasive in the polishing composition during the storage and to prevent formation of scratches on the object to be polished, due to the abrasive. Namely, as the abrasive, colloidal silica is preferred. There are two types of colloidal silica i.e. one obtained by particle growth of ultrafine particle colloidal silica obtained by ion exchange of sodium silicate, and the other produced by hydrolyzing an alkoxysilane with an acid or alkali (colloidal silica made by a so-called sol-gel method). Among these, the colloidal silica made by the sol-gel method is preferred, since a product of high purity is available.

The specific surface area of the colloidal silica is usually within a range of from 50 to 300 m$^2$/g, preferably from 70 to 150 m$^2$/g. In the present invention, the specific surface area is meant for a value measured by a so-called nitrogen adsorption method (BET method), and this specific surface area represents the primary particle size. Namely, the primary particle size of the abrasive in the present invention can be obtained by the formula of primary particle size= 2727/(specific surface area), and the primary particle size corresponding to the specific surface area of from 50 to 300 m$^2$/g, will be from 9 to 55 nm.

If the specific surface area of the abrasive is smaller than this range, the action of mechanical polishing tends to be large, whereby the stock removal rate against the insulating layer or the copper layer tends to be too high, or the surface roughness of the polished surface tends to be large, or scratches are likely to be formed, such being undesirable. On the other hand, if the specific surface area is larger than this range, the action of mechanical polishing tends to be small, and the stock removal rate against the tantalum-containing compound layer tends to be small, such being undesirable.

The content of the abrasive in the polishing composition of the present invention is usually from 10 to 200 g/l, preferably from 30 to 100 g/l, based on the polishing composition. If the content of the abrasive is smaller than this range, the mechanical polishing power tends to be low, and the stock removal rate against the tantalum-containing compound layer tends to be low, such being undesirable. On the other hand, if the content of the abrasive exceeds this range, the mechanical polishing power tends to be strong, and the stock removal rate against the insulating layer tends to be large, such being undesirable.

The pH of the polishing composition of the present invention is usually within a range of from 3 to 6, preferably within a range of from 4 to 5. As mentioned above, by neutralizing the pH, corrosion of the copper layer surface can be avoided. On the other hand, if the pH is increased too much, the stock removal rate against the tantalum-containing compound also decreases. In such a trade-off situation, a proper performance is obtainable within this range. Namely, if the pH is smaller than this range, the copper layer surface is likely to be corroded. On the other hand, if the pH exceeds this range, the stock removal rate against the tantalum-containing compound tends to be low, such being undesirable.

The oxidizing agent which is mentioned but must not be contained in the first invention, is meant for a compound which acts on the copper layer surface to form copper oxide or copper hydroxide. Specifically, it may, for example, be hydrogen peroxide, urea, iron ions, cerium ions, chlorine, bromine or nitric acid.

The medium for the polishing composition of the present invention is water. The water is preferably one having impurities removed as far as possible, so that the above-described additives can accurately perform their roles. Namely, distilled water or water obtained by removing impurities by an ion exchange resin and removing suspended matters through a filter, is preferred. According to the first invention, a low stock removal rate can be realized for polishing of the copper layer and the insulating layer, while a high stock removal rate can be realized for polishing of the tantalum-containing compound layer. The stock removal rates are such that in the case of a blanket layer (a layer having only a copper layer, a tantalum layer or an insulating layer formed without any pattern), the copper removal rate is usually at most 100 Å/min, the tantalum removal rate is usually at least 400 Å/min, and the insulating layer (silica layer) removal rate is usually at most 300 Å/min.

A specific method of using the polishing composition of the first invention will be shown below.

In the first polishing, using a common abrasive, removal by polishing of all the copper layer to be removed (overpolishing) is carried out, and then, using the polishing composition of the first invention, all the barrier layer to be removed, is removed by polishing. By this method, polishing can be carried out without increasing the dishing of the copper wiring portions formed by the first polishing.

According to the second invention, a low stock removal rate can be realized for polishing of an insulating layer, a high stock removal rate can be realized for polishing a tantalum-containing compound layer, and further, for polishing the copper layer, the stock removal rate can freely be adjusted by changing the amount of hydrogen peroxide to be incorporated. The stock removal rates are such that against the respective blanket films, the copper removal rate is usually from 300 to 1,000 Å/min, the tantalum removal rate is usually at least 400 Å/min, and the insulating layer (silica layer) removal rate is usually at most 300 Å/min.

A specific method of using the polishing composition of the second invention will be shown below.

In the first polishing, using a common abrasive, the copper layer to be removed, is removed by polishing so that only the surface layer will remain (underpolishing), and then, using the polishing composition of the second invention, the remaining copper layer to be removed and the barrier layer to be removed are all removed by polishing. According to this method, there will be no substantial dishing of the copper wiring portions after the first polishing, and in the second polishing, by adjusting the stock removal rate against copper, the stock removal rates against the copper layer and the barrier layer can be brought to be substantially the same, whereby dishing of the copper wiring portions can be improved over the above-described overpolishing method. However, with the polishing composition of the second invention, dishing of the copper wiring portions will form to some extent due to the difference in the stock removal rate as between the copper layer and the insulating layer.

Now, the polishing process of the present invention will be described in further detail.

Namely, in the first polishing, using a common abrasive, the copper layer to be removed is removed so as to leave only a thin skin (underpolishing). Then, in the second polishing, using the polishing composition of the second invention, the remaining copper layer to be removed is all removed by polishing, and then in the third polishing, using the polishing composition of the first invention, the barrier layer to be removed is all removed by polishing.

According to this process, after the first polishing, there will be no substantial dishing of copper wiring portions, and in the second polishing, by adjusting the stock removal rate against copper, the stock removal rates against the copper layer and the barrier layer can be brought to substantially the same level, whereby there will be no substantial dishing also in the second polishing. Thereafter, in the third polishing, the copper removal rate is suppressed, whereby dishing of the copper wiring portions will not increase, and dishing will rather be improved corresponding to the amount of removal of the barrier layer. Accordingly, as compared with polishing employing either one of the polishing composition of the first invention or the polishing composition of the second invention, a superior polished surface can be obtained by sequentially using and controlling the two types of the polishing compositions of the present invention in accordance with the polishing process of the present invention.

Further, in the polishing process of the present invention, the first invention and the second invention differ only with respect to the presence or absence of hydrogen peroxide, whereby polishing can be accomplished efficiently as described below even though polishing is carried out till the third polishing. Namely, the polishing composition of the first invention is preliminarily prepared, and in the second polishing, hydrogen peroxide is added to the polishing composition of the first invention at the same time as the initiation, in a controlled predetermined amount at the operation site, to prepare the polishing composition of the second invention, and the copper layer to be removed, is polished. Then, in the third polishing, mixing of hydrogen peroxide is stopped, and using the polishing composition of the first invention, polishing is carried out until the barrier layer is removed. According to this process, the polishing composition can continuously be changed from "the second invention" for the second polishing to "the first invention" for the third polishing, whereby the control is easy, and such change can be carried out on the same polishing table.

The polishing compositions of the present invention are usually prepared by mixing and dispersing in water the above-mentioned respective components, i.e. abrasive grains, oxalic acid, ethylenediamine, benzotriazole, and, in the case of the second invention, hydrogen peroxide. The abrasive grains are uniformly dispersed in the composition to form a suspension, and other components are dissolved in water. An optional method may be employed to mix such compositions. For example, they may be stirred by a vane-type stirrer, or they may be dispersed by ultrasonic wave dispersion.

Further, as mentioned above, the first invention is prepared preliminarily, and at the time of use, it may be adjusted to the composition of the second invention, as the case requires.

Further, the polishing composition of the present invention may be prepared, stored or transported in the form of a stock solution having a relatively high concentration, so that it may be diluted for use at the time of actual polishing operation. The above-mentioned preferred range for the concentration is one for the actual polishing operation. Needless to say, in the case of adopting such a method of use, the stock solution during the storage or transportation is a solution having a higher concentration.

The contents of various components as defined for the compositions of the present invention represent the contents in the compositions finally prepared for polishing. Namely, when hydrogen peroxide is added for incorporation of an oxidizing agent immediately prior to the polishing or when ethylenediamine is added to adjust the pH, the various contents are defined as a composition having such additional amounts added. Likewise, the contents in the compositions shown in the Examples given hereinafter, represent the contents in the final compositions immediately prior to the polishing operations.

Now, the practical embodiments of the present invention will be described in detail with reference to Examples. However, it should be understood that the present invention is by no means restricted to such specific Examples.

EXAMPLE 1

Using, as abrasive grains, colloidal silica (specific surface area: 95 $m^2$/g) prepared by a sol-gel method, a polishing composition was prepared to have the proportions as identified in Table 1. As an oxidizing agent, hydrogen peroxide was used, and using as such hydrogen peroxide a commercially available 31% aqueous solution, 3 g/l as pure hydrogen peroxide was mixed immediately prior to polishing in the case of "Oxidizing agent, Present".

As objects to be polished, a 6 inch silicon wafer having a copper layer formed in a thickness of 10,000 Å by sputtering, a 6 inch silicon wafer having a tantalum-layer formed in a thickness of 2,000 Å by sputtering and a 6 inch silicon wafer having a silica layer (TEOS layer) formed in a thickness of 10,000 Å by CVD, were used, and the layer-formed side of each wafer was polished.

The polishing method was as follows.
Polishing Conditions
  Polishing machine: AVANTI 472 (manufactured by IPEC Westech Co.)
  Polishing pad: IC-1000 (manufactured by Rodel Nitta Co.)
  Polishing time: 1 min.
  Platen rotational speed: 30 rpm
  Carrier rotational speed: 30 rpm
  Down force: 3.0 psi (about 211 g/$cm^2$)
  Polishing composition supply feed rate: 150 ml/l
After polishing, the wafer was sequentially washed and dried, and the stock removal rate was obtained by the following method.
Copper Layer and Tantalum Layer Removal Rates:
  Resistance type thickness measuring apparatus RS-35C (manufactured by KLA-Tencor Co.)
Silica layer removal rate: Optical thickness measuring meter Lambda-Å (manufactured by Dainippon Screen K.K.)
Measuring method: 49 points were measured in the diameter direction of the wafer. The stock removal rate was calculated from the difference in thickness as between before and after polishing.

Then, the copper layer wafer after polishing was observed by an optical microscope. The results are shown in Table 1 together with the composition of the polishing composition. Evaluation in Example 1 was made in accordance with the following standards.
Evaluation Standards
  ⊚: No corrosion of copper observed.
  ◯: Very small corrosions with a diameter of not more than 0.5 μm observed.

X: Corrosions with a diameter exceeding 0.5 μm observed.

TABLE 1

|   | No. | Abrasive (g/l) | Oxalic acid mol/l | Ethylene-diamine mol/l | Benzo-triazole mol/l | Cu removal rate Å/min OP | Cu removal rate Å/min OA | Ta removal rate Å/min OP | Ta removal rate Å/min OA | TEOS removal rate Å/min OP | TEOS removal rate Å/min OA | Cu surface state OP | Cu surface state OA |
|---|---|---|---|---|---|---|---|---|---|---|---|---|---|
| AA | 1 | 0 | 0.005 | 0.003 | 0.0008 | 30 | 5 | 0 | 0 | 0 | 0 | ◉ | ◉ |
| BB | 2 | 5 | 0.005 | 0.003 | 0.0008 | 200 | 20 | 230 | 250 | 110 | 130 | ◉ | ◉ |
| BB | 3 | 10 | 0.005 | 0.003 | 0.0008 | 230 | 30 | 300 | 300 | 150 | 140 | ◉ | ◉ |
| BB | 4 | 30 | 0.005 | 0.003 | 0.0008 | 300 | 30 | 390 | 400 | 190 | 200 | ◉ | ◉ |
| BB | 5 | 100 | 0.005 | 0.003 | 0.0008 | 550 | 40 | 580 | 600 | 250 | 290 | ◉ | ◉ |
| BB | 6 | 200 | 0.005 | 0.003 | 0.0008 | 800 | 50 | 840 | 900 | 390 | 460 | ◉ | ◉ |
| BB | 7 | 250 | 0.005 | 0.003 | 0.0008 | 1000 | 60 | 1010 | 1100 | 480 | 580 | ◉ | ◉ |
| AA | 8 | 50 | 0 | 0.003 | 0.0008 | 50 | 40 | 10 | 10 | 40 | 50 | ◉ | ◉ |
| BB | 9 | 50 | 0.0005 | 0.003 | 0.0008 | 200 | 40 | 80 | 100 | 100 | 110 | ◉ | ◉ |
| BB | 10 | 50 | 0.001 | 0.003 | 0.0008 | 400 | 40 | 180 | 210 | 130 | 140 | ◉ | ◉ |
| BB | 11 | 50 | 0.003 | 0.003 | 0.0008 | 550 | 40 | 400 | 470 | 160 | 170 | ◉ | ◉ |
| BB | 12 | 50 | 0.004 | 0.003 | 0.0008 | 600 | 40 | 460 | 500 | 180 | 180 | ◉ | ◉ |
| BB | 13 | 50 | 0.006 | 0.003 | 0.0008 | 620 | 40 | 500 | 520 | 190 | 190 | ◉ | ◉ |
| BB | 14 | 50 | 0.000 | 0.003 | 0.0008 | 580 | 40 | 510 | 520 | 200 | 200 | ◉ | ◉ |
| BB | 15 | 50 | 0.010 | 0.003 | 0.0008 | 550 | 40 | 500 | 550 | 210 | 210 | ◉ | ◉ |
| BB | 16 | 50 | 0.015 | 0.003 | 0.0008 | 480 | 40 | 520 | 610 | 220 | 220 | ○ | ○ |
| AA | 17 | 50 | 0.005 | 0 | 0.0008 | 500 | 40 | 520 | 540 | 680 | 700 | ◉ | ◉ |
| BB | 18 | 50 | 0.005 | 0.0005 | 0.0008 | 510 | 40 | 520 | 530 | 400 | 410 | ◉ | ◉ |
| BB | 19 | 50 | 0.005 | 0.001 | 0.0008 | 500 | 50 | 500 | 540 | 290 | 310 | ◉ | ◉ |
| BB | 20 | 50 | 0.005 | 0.002 | 0.0008 | 520 | 40 | 520 | 550 | 230 | 250 | ◉ | ◉ |
| BB | 21 | 50 | 0.005 | 0.004 | 0.0008 | 520 | 40 | 510 | 540 | 190 | 200 | ◉ | ◉ |
| BB | 22 | 50 | 0.005 | 0.005 | 0.0008 | 510 | 50 | 520 | 530 | 180 | 200 | ◉ | ◉ |
| BB | 23 | 50 | 0.005 | 0.007 | 0.0008 | 520 | 40 | 400 | 440 | 180 | 180 | ○ | ○ |
| AA | 24 | 50 | 0.005 | 0.003 | 0 | 3200 | 40 | 500 | 530 | 220 | 210 | x | x |
| BB | 25 | 50 | 0.005 | 0.003 | 0.0002 | 1200 | 40 | 510 | 520 | 220 | 210 | ○ | ○ |
| BB | 26 | 50 | 0.005 | 0.003 | 0.0004 | 550 | 50 | 500 | 530 | 210 | 220 | ◉ | ◉ |
| BB | 27 | 50 | 0.005 | 0.003 | 0.0006 | 500 | 40 | 510 | 520 | 220 | 210 | ◉ | ◉ |
| BB | 28 | 50 | 0.005 | 0.003 | 0.0008 | 450 | 40 | 510 | 520 | 230 | 220 | ◉ | ◉ |
| BB | 29 | 50 | 0.005 | 0.003 | 0.0012 | 420 | 50 | 510 | 530 | 220 | 220 | ◉ | ◉ |
| BB | 30 | 50 | 0.005 | 0.003 | 0.0016 | 400 | 40 | 500 | 530 | 220 | 210 | ◉ | ◉ |
| BB | 31 | 50 | 0.005 | 0.003 | 0.0020 | 380 | 40 | 510 | 520 | 210 | 220 | ◉ | ◉ |
| BB | 32 | 50 | 0.005 | 0.003 | 0.0030 | 350 | 40 | 500 | 520 | 220 | 220 | ◉ | ◉ |

AA: Comparative Example,
BB: Present invention,
OP: Oxidizing agent,
OA: Oxidizing agent, Absent The following has become apparent from the results of Table 1. Firstly, in a case of No. 1 where no abrasive is incorporated, substantially no adequate stock removal rate can be obtained against any one of copper, tantalum and insulating layers. Further, in a case of No. 8 where no oxalic acid is incorporated, no adequate stock removal rate can be obtained against tantalum. In a case of No. 17 where no ethylenediamine is incorporated, the insulating layer removal rate is high, and if this is adopted in a practical copper CMP process, it is likely that the insulating layer will be polished more than necessary. In a case of No. 24 where no benzotriazole is incorporated, after the polishing, corrosion is observed on the surface of copper.

Further, from the results of Examples, the functions of the respective components are considered to be as follows.

Namely, with respect to the abrasive, as its content increases, the stock removal rate against each layer will increase. Accordingly, the stock removal rate against each layer can be adjusted by the content of the abrasive. Oxalic acid changes the stock removal rate against the tantalum layer. Ethylenediamine serves to lower the stock removal rate against the insulating layer, and benzotriazole serves to prevent corrosion of the copper layer after polishing.

EXAMPLE 2

Using, as abrasive grains, colloidal silica (specific surface area: 110 m²/g) prepared by a sol-gel method, a polishing composition was preliminarily prepared so that as the final composition,. the abrasive grain concentration would be 50 g/l, the oxalic acid concentration would be 0.005 mol/l, and benzotriazole would be 0.0007 mol/l. Then, ethylenediamine was added to adjust the pH as identified in Table 2. Further, two types of compositions were prepared so that one type contained 3 g/l of hydrogen peroxide and the other type contained no hydrogen peroxide. Then, polishing tests were carried out in the same manner as in Example 1. The results of the tests are shown in Table 2. When the pH is low, corrosion tends to form on the copper surface after polishing. On the other hand, if it is high, the tantalum removal rate tends to be low.

TABLE 2

| No. | pH | Cu removal rate Å/min OP | Cu removal rate Å/min OA | Ta removal rate Å/min OP | Ta removal rate Å/min OA | TEOS removal rate Å/min OP | TEOS removal rate Å/min OA | Cu surface state OP | Cu surface state OA |
|---|---|---|---|---|---|---|---|---|---|
| 33 | 2 | 500 | 40 | 520 | 540 | 680 | 700 | ○ | ○ |
| 34 | 3 | 510 | 40 | 520 | 530 | 400 | 410 | ⊙ | ⊙ |
| 35 | 4 | 500 | 50 | 500 | 540 | 290 | 310 | ⊙ | ⊙ |
| 36 | 5 | 520 | 40 | 520 | 550 | 230 | 250 | ⊙ | ⊙ |
| 37 | 6 | 520 | 40 | 410 | 440 | 190 | 200 | ⊙ | ⊙ |
| 38 | 7 | 510 | 50 | 320 | 330 | 180 | 200 | ⊙ | ⊙ |

OP: Oxidizing agent, Present,
OA: Oxidizing agent, Absent

EXAMPLE 3

Colloidal silica (prepared by a sol-gel method) having a specific surface area as identified in Table 3 was prepared. Then, a polishing composition was prepared so that as the final composition of the polishing composition, the abrasive grain concentration was 50 g/l, the oxalic acid concentration was 0.005 mol/l, the ethylenediamine concentration was 0.003 mol/l, and the benzotriazole concentration was 0.0008 mol/l. Then, polishing tests were carried out in the same manner as in Example 1. The results are shown in Table 3.

TABLE 3

| No. | Specific surface area m²/g | Cu removal rate Å/min OP | Cu removal rate Å/min OA | Ta removal rate Å/min OP | Ta removal rate Å/min OA | TEOS removal rate Å/min OP | TEOS removal rate Å/min OA | Cu surface state OP | Cu surface state OA |
|---|---|---|---|---|---|---|---|---|---|
| 39 | 30 | 1,100 | 100 | 900 | 900 | 500 | 500 | ⊙ | ⊙ |
| 40 | 50 | 800 | 50 | 840 | 900 | 390 | 460 | ⊙ | ⊙ |
| 41 | 70 | 550 | 40 | 580 | 600 | 250 | 290 | ⊙ | ⊙ |
| 42 | 150 | 300 | 30 | 390 | 400 | 190 | 200 | ⊙ | ⊙ |
| 43 | 300 | 230 | 30 | 300 | 300 | 150 | 140 | ⊙ | ⊙ |
| 44 | 500 | 200 | 20 | 230 | 250 | 110 | 100 | ⊙ | ⊙ |

OP: Oxidizing agent, Present,
OA: Oxidizing agent, Absent

When the specific surface area was set to be small, the stock removal rate against each layer increased. However, in No. 39, relatively shallow scratches which would bring about no serious problem, were observed on the surface after polishing. On the other hand, if the specific surface area becomes large, the stock removal rate tends to be small against all of the layers.

EXAMPLE 4

Colloidal silica (prepared by a sol-gel method) having a specific surface area of 80 g/l, was prepared. Then, a polishing composition was prepared so that as the final composition of the polishing composition, the abrasive grain concentration was 50 g/l, the oxalic acid concentration was 0.006 mol/l, the ethylenediamine concentration was 0.003 mol/l and the benzotriazole concentration was 0.0008 mol/l. Then, hydrogen peroxide was added so that the concentration of hydrogen peroxide would be as shown in Table 4, to prepare a polishing composition. Using the polishing composition, polishing tests were carried out in the same manner as in Example 1.

The results of the polishing tests are shown in Table 4. From the test results, it was found that as the content of hydrogen peroxide increased, the copper layer removal rate increased, while the tantalum layer removal rate and the insulating layer removal rate were substantially constant or slightly decreased.

TABLE 4

| No. | Hydrogen peroxide | Cu removal rate Å/min | Ta removal rate Å/min | TEOS removal rate Å/min | Cu surface state |
|---|---|---|---|---|---|
| 45 | 0.5 | 150 | 500 | 200 | ○ |
| 46 | 1 | 250 | 450 | 200 | ⊙ |
| 47 | 3 | 500 | 430 | 200 | ⊙ |
| 48 | 10 | 1000 | 430 | 200 | ⊙ |
| 49 | 30 | 1300 | 430 | 200 | ⊙ |
| 50 | 50 | 1300 | 450 | 200 | ⊙ |

EXAMPLE 5

For the first polishing, a polishing composition comprising 100 g/l of colloidal silica, 0.1 mol/l of glycine and 6 g/l of hydrogen peroxide, was prepared. Using this polishing composition for the first polishing, the copper layer portion of a CMP test wafer for forming a copper printed wiring (926 wafer having a copper layer formed in a thickness of 15,000 Å, manufactured by SEMATECH) was removed by polishing in a thickness of about 13,000 Å. Then, a polishing composition as identified in No. 28 in Example 1 was prepared, and firstly, hydrogen peroxide was added, and the copper layer portion to be removed was polished so that the second polishing was completed when all of the copper layer portion to be removed, was removed. Then, using the same polishing composition as used in the second polishing except that no hydrogen peroxide was incorporated, only the tantalum layer was polished, and the third polishing was completed when all of the tantalum layer portion to be removed, was polished off.

All of the polishing operations were carried out under the following polishing conditions.

Polishing conditions

Polishing machine: AVANTI 472 (manufactured by IPEC Westech Co.)

Polishing pad: IC-1000 (manufactured by Rodel Nitta Co.)

Platen rotational speed: 30 rpm

Carrier rotational speed: 30 rpm

Down force: 3.0 psi

Polishing composition supply feed rate: 150 ml/l Then, dishing of a copper wiring portion with a center chip width of 50 m was measured by means of a profiler (P-2, manufactured by KLA-Tencor). As a result, the dishing degree was 350 Å.

COMPARATIVE EXAMPLE 1

In the same manner as in Example 5, a polishing composition for the first polishing was prepared, and a copper layer portion of a CMP test wafer for forming a copper printed wiring, was removed by polishing in a thickness of about 13,000 Å. Then, the same polishing composition for the second polishing (containing hydrogen peroxide) as in Example 5, was prepared, and all of the copper layer portions to be removed were polished off. Further, continuously, the tantalum film portions to be removed were all polished off to complete the second polishing. The polishing conditions were the same as in Example 5. The dishing was measured, and as a result, the dishing degree was 1,400 Å.

COMPARATIVE EXAMPLE 2

The same polishing composition for the first polishing as used in Example 5, was prepared. Using the polishing composition, the copper layer portion of a CMP test wafer for forming a copper printed wiring, was polished, and the polishing was completed when all of the copper layer portions to be removed, were removed by polishing. Then, the same polishing composition for the third polishing (containing no hydrogen peroxide) as in Example 5 was prepared, and all of the tantalum layer portions to be removed were polished off to complete the second polishing. The polishing conditions were the same as in Example 5.

The dishing was measured, and as a result, the dishing degree was 2,200 Å.

EFFECTS OF THE INVENTION

The polishing compositions of the present invention provide polishing compositions suitable for the second polishing and third polishing, which are excellent in the corrosion resistance against the copper layer and which provide a high stock removal rate against the tantalum-containing compound, in a CMP process for producing semiconductor devices containing a copper layer and a tantalum-containing compound. Further, the polishing process of the present invention provides a polishing process whereby a good dishing state can be obtained by controlling the amount of hydrogen peroxide in the polishing composition so that in the second polishing, a proper amount of hydrogen peroxide is added, and in the third polishing, hydrogen peroxide is removed.

What is claimed is:

1. A polishing composition comprising the following components and not containing an oxidizing agent:

(a) an abrasive, (b) oxalic acid, (c) an ethylenediamine derivative, (d) a benzotriazole derivative, and (e) water.

2. The polishing composition according to claim 1, wherein the abrasive is silicon dioxide.

3. The polishing composition according to claim 1, wherein the abrasive is colloidal silica.

4. The polishing composition according to claim 1, wherein the abrasive has a specific surface area of from 50 to 300 $m^2/g$ and its content is from 10 to 200 g/l, based on the polishing composition.

5. The polishing composition according to claim 1, wherein the content of oxalic acid is within a range of from 0.001 to 0.01 mol/l, based on the polishing composition.

6. The polishing composition according to claim 1, wherein the ethylenediamine derivative is ethylenediamine and its content is from 0.001 to 0.005 mol/l, based on the polishing composition.

7. The polishing composition according to claim 1, wherein the benzotriazole derivative is benzotriazole and its content is from 0.0004 to 0.002 mol/l, based on the polishing composition.

8. A polishing composition comprising the following components:

(a) an abrasive, (b) oxalic acid, (c) an ethylenediamine derivative, (d) a benzotriazole derivative, (e) water, and (f) hydrogen peroxide.

9. The polishing composition according to claim 2, wherein the content of hydrogen peroxide is within a range of from 1 to 30 g/l, based on the polishing composition.

10. The polishing composition according to claim 8, wherein the abrasive is silicon dioxide.

11. The polishing composition according to claim 8, wherein the abrasive is colloidal silica.

12. The polishing composition according to claim 8, wherein the abrasive has a specific surface area of from 50 to 300 $m^2/g$ and its content is from 10 to 200 g/l, based on the polishing composition.

13. The polishing composition according to claim 8, wherein the content of oxalic acid is within a range of from 0.001 to 0.01 mol/l, based on the polishing composition.

14. The polishing composition according to claim 8, wherein the ethylenediamine derivative is ethylenediamine and its content is from 0.001 to 0.005 mol/l, based on the polishing composition.

15. The polishing composition according to claim 8, wherein the benzotriazole derivative is benzotriazole and its content is from 0.0004 to 0.002 mol/l, based on the polishing composition.

16. The polishing composition according to claim 1 or 8, which has a pH within a range of from 3 to 6.

* * * * *